(12) United States Patent
Hussin et al.

(10) Patent No.: US 9,941,382 B2
(45) Date of Patent: Apr. 10, 2018

(54) METAL-SEMICONDUCTOR-METAL (MSM) HETEROJUNCTION DIODE

(71) Applicant: CARNEGIE MELLON UNIVERSITY, Pittsburgh, PA (US)

(72) Inventors: Rozana Hussin, Pittsburgh, PA (US); Yixuan Chen, Pittsburgh, PA (US); Yi Luo, Pittsburgh, PA (US)

(73) Assignee: Carnegie Mellon University, Pittsburgh, PA (US)

( * ) Notice: Subject to any disclaimer, the term of this patent is extended or adjusted under 35 U.S.C. 154(b) by 0 days.

(21) Appl. No.: 15/379,422

(22) Filed: Dec. 14, 2016

(65) Prior Publication Data

US 2017/0162666 A1 Jun. 8, 2017

Related U.S. Application Data

(62) Division of application No. 14/391,123, filed as application No. PCT/US2013/037358 on Apr. 19, 2013, now Pat. No. 9,553,163.

(Continued)

(51) Int. Cl.
*H01L 29/66* (2006.01)
*H01L 29/06* (2006.01)
(Continued)

(52) U.S. Cl.
CPC .... *H01L 29/66219* (2013.01); *H01L 29/0665* (2013.01); *H01L 29/6603* (2013.01);
(Continued)

(58) Field of Classification Search
CPC ............ H01L 29/0665; H01L 29/6603; H01L 29/6609; H01L 29/66128; H01L 29/66204;
(Continued)

(56) References Cited

U.S. PATENT DOCUMENTS

| 3,553,365 A | 1/1971 | Jauernik |
| 4,038,563 A | 7/1977 | Zuleeg |

(Continued)

FOREIGN PATENT DOCUMENTS

| JP | 61-35384 | 2/1986 |
| KR | 10-2010-0037007 | 4/2010 |

(Continued)

OTHER PUBLICATIONS

International Search Report and Written Opinion dated Sep. 25, 2013 for Int'l. Appln. No. PCT/US2013/037358, 10 pgs.
(Continued)

*Primary Examiner* — Eduardo A Rodela
(74) *Attorney, Agent, or Firm* — Fish & Richardson P.C.

(57) ABSTRACT

In one aspect, a diode comprises: a semiconductor layer having a first side and a second side opposite the first side, the semiconductor layer having a thickness between the first side and the second side, the thickness of the semiconductor layer being based on a mean free path of a charge carrier emitted into the semiconductor layer; a first metal layer deposited on the first side of the semiconductor layer; and a second metal layer deposited on the second side of the semiconductor layer.

20 Claims, 6 Drawing Sheets

Related U.S. Application Data

(60) Provisional application No. 61/687,163, filed on Apr. 19, 2012.

(51) Int. Cl.
  *H01L 29/872* (2006.01)
  *H01L 29/861* (2006.01)
  *H01L 27/24* (2006.01)
  *H01L 27/08* (2006.01)

(52) U.S. Cl.
  CPC .... *H01L 29/6609* (2013.01); *H01L 29/66121* (2013.01); *H01L 29/66128* (2013.01); *H01L 29/66136* (2013.01); *H01L 29/861* (2013.01); *H01L 29/872* (2013.01); *H01L 27/0814* (2013.01); *H01L 27/2409* (2013.01)

(58) Field of Classification Search
  CPC ......... H01L 29/66212; H01L 29/66219; H01L 29/66136; H01L 29/66143; H01L 2924/1203; H01L 2924/12037; H01L 29/66121; H01L 29/66151; H01L 29/861; H01L 29/87; H01L 29/88; H01L 27/0814; H01L 27/2409
  See application file for complete search history.

(56) References Cited

U.S. PATENT DOCUMENTS

| | | | |
|---|---|---|---|
| 4,484,211 A | | 11/1984 | Takemoto |
| 4,727,408 A | * | 2/1988 | Hatakeyama ....... H01L 27/0255 257/544 |
| 5,019,530 A | | 5/1991 | Kleinsasser et al. |
| 5,331,186 A | | 7/1994 | Morizuka |
| 5,859,464 A | * | 1/1999 | Hollricher ........... H01L 31/1085 257/432 |
| 5,907,159 A | | 5/1999 | Roh |
| 8,399,883 B2 | | 3/2013 | Park et al. |
| 9,553,163 B2 | | 1/2017 | Hussin et al. |
| 2004/0016922 A1 | | 1/2004 | Allenspach et al. |
| 2005/0078099 A1* | | 4/2005 | Amundson ............. H01L 27/12 345/204 |
| 2006/0220162 A1 | | 10/2006 | Sato et al. |
| 2007/0015348 A1 | | 1/2007 | Hsu et al. |
| 2008/0217603 A1 | | 9/2008 | Takada et al. |
| 2009/0032817 A1 | | 2/2009 | Li et al. |
| 2010/0102298 A1 | | 4/2010 | Wu |
| 2010/0237313 A1 | | 9/2010 | Mikawa et al. |
| 2011/0062450 A1 | | 3/2011 | Gammon et al. |
| 2011/0210260 A1 | | 9/2011 | Sekiguchi |
| 2012/0068157 A1 | | 3/2012 | Kub |
| 2013/0208529 A1* | | 8/2013 | Tomotani ................ G11C 29/76 365/148 |
| 2014/0302310 A1* | | 10/2014 | Cowell, III ........... H01L 29/154 428/336 |
| 2015/0137178 A1 | | 5/2015 | Hussin et al. |
| 2015/0255588 A1 | | 9/2015 | Luo et al. |

FOREIGN PATENT DOCUMENTS

| | | |
|---|---|---|
| WO | WO2005106927 | 11/2005 |
| WO | WO2014039550 | 3/2014 |

OTHER PUBLICATIONS

Rozana Hussin et al., "Metal-semiconductor-metal heterojunction diodes consisting of a thin layer of crystal silicon," Applied Physics Letters 102:pp. 1-4, (2013).

Ch. Buchal et al., "Silicon-Based Metal-Semiconductor-Metal Detectors," MRS Bulletin, pp. 55-59 (1998).

F. Ruders et al., "Vertical MSM photodiodes in silicon based on epitaxial Si/CoSi2/Si," Thin Solid Films 294 (1997) 351-353.

S. M. Sze et al., "Current Transport in Metal-Semiconductor-Metal (MSM) Structures," Solid-State Electronics Pergamon Press 1971. vol. 14, pp. 1209-1218.

European Search Report in corresponding Application No. 13778627.3, dated Nov. 3, 2015, pp. 1-8.

International Search Report and Written Opinion dated Dec. 27, 2013 for International Appln. No. PCT/US2013/058053, pp. 1-10.

Non-Final Office Action in U.S. Appl. No. 14/425,403 dated Dec. 4, 2015, pp. 1-17.

"Schottky diode," Wikipedia, https://en.wikipedia.org/wiki/Schottky_13 diode, downloaded Feb. 26, 2016, pp. 1-7.

Response to Non-Final Office Action in U.S. Appl. No. 14/425,403, dated Dec. 4, 2015, filed Apr. 4, 2016, 15 pages.

Final Office Action in U.S. Appl. No. 14/425,403, dated May 31, 2016, 12 pages.

Response to Final Office Action in U.S. Appl. No. 14/425,403, dated May 31, 2016, filed Aug. 25, 2016, 15 pages.

Office Action in U.S. Appl. No. 14/391,123, dated Jul. 14, 2015, pp. 1-9.

Response to Office Action in U.S. Appl. No. 14/391,123, dated Jul. 14, 2015, filed Oct. 13, 2015, pp. 1-9.

Final Office Action in U.S. Appl. No. 14/391,123, dated Dec. 31, 2015, pp. 1-12.

Response to Final Office Action in U.S. Appl. No. 14/391,123, dated Dec. 31, 2015, filed Feb. 26, 2016, pp. 1-9.

Office Action in U.S. Appl. No. 14/391,123, dated Apr. 1, 2016, pp. 1-13.

Response to Office Action in U.S. Appl. No. 14/391,123, dated Apr. 1, 2016, filed Jun. 29, 2016, pp. 1-9.

Office Action in corresponding Russian Application No. 2014146304, dated Mar. 13, 2017, pp. 1-17.

* cited by examiner

METAL-SEMICONDUCTOR-METAL (MSM) HETEROJUNCTION DIODE

CLAIM OF PRIORITY

This application is a divisional application and claims the benefit of priority under 35 U.S.C. § 121 to U.S. patent application Ser. No. 14/391,123, filed on Oct. 7, 2014, which is a U.S. National Stage Application under 35 U.S.C. § 371 of and claims priority to International Application Number PCT/US13/037358, filed on Apr. 19, 2013, which claims the benefit of priority under 35 U.S.C. § 119(e) to provisional U.S. Patent Application Ser. No. 61/687,163, filed on Apr. 19, 2012, the entire contents of each of which are hereby incorporated by reference.

FIELD OF USE

The present disclosure relates generally to diodes, and specifically to high speed diode devices.

BACKGROUND

Typical diodes have a cut-off frequency in the high gigahertz (GHz) or low terahertz (THz) range (e.g., a cut-off frequency less than 10 THz), which set a limit on the operating frequency range. Examples of such diodes include a Schottky diode, a backward tunneling diode, and a metal-insulator-metal (MIM) tunneling diode.

High-speed diodes, e.g., diodes having a cut-off frequency greater than 10 THz, are key elements for a broad range of applications. For example, a high speed diode combined with an optical antenna (referred as a rectenna) can lead to operations in optical frequencies, such as coherent generation and detection of infrared to far-infrared signals, and rectification of solar radiation for energy conversion. In these operations, the optical antenna is responsible for light collection and emission, while the diode must operate fast enough to match the corresponding optical frequencies and possess other required current-voltage (I-V) characteristics, such as excellent nonlinearity and rectification. Thus, obtaining highly nonlinear diodes having a cut-off frequency and operational speed higher than 100 THz is of profound technological and scientific importance.

SUMMARY

The present disclosure describes apparatus and methods relating to a metal-semiconductor-metal (MSM) heterojunction diode. A thickness of a crystalline semiconductor layer of an MSM diode is less than or comparable to a mean free path of charge carriers emitted into a semiconductor layer of the MSM diode, which can result in near ballistic carrier transport across the semiconductor layer and lead to an exceptionally high thermionic emission current density while exhibiting excellent nonlinearity and rectification. A series resistance of the MSM diode can be extremely small. A cut-off frequency of the MSM diode can exceed 100 THz.

In one aspect of the present disclosure, a diode comprises: a semiconductor layer having a first side and a second side opposite the first side, the semiconductor layer having a thickness between the first side and the second side, the thickness of the semiconductor layer being based on a mean free path of a charge carrier emitted into the semiconductor layer; a first metal layer deposited on the first side of the semiconductor layer; and a second metal layer deposited on the second side of the semiconductor layer.

Implementations of the disclosure can include one or more of the following features. The thickness of the semiconductor layer may be comparable to or less than the mean free path of the charge carrier emitted into the semiconductor layer. In some implementations, the diode may have a cut-off frequency exceeding 100 THz. In some implementations, the diode may have a cut-off frequency exceeding 1000 THz. In some implementations, the first metal layer and the second metal layer may be the same metal. In some implementations, the first metal layer may be a first metal, the second metal layer may be a second metal, and the first metal and the second metal may be different metals. An interface of the semiconductor layer may be degenerately doped for creation of an ohmic contact. The semiconductor layer may include one or more single crystalline semiconductors, polycrystalline semiconductors, or a combination. The semiconductor layer may include one or more semiconductors such as silicon (Si), germanium (Ge), silicon germanium (SiGe), aluminum antimonide (AlSb), gallium antimonide (GaSb), gallium arsenide (GaAs), indium antimonide (InSb), indium arsenide (InAs), indium gallium arsenide (InGaAs), gallium nitride (GaN), indium phosphide (InP), cadmium selenide (CdSe), cadmium telluride (CdTe), cadmium sulfide (CdS), zinc selenide (ZnSe), zinc telluride (ZnTe), zinc sulfide (ZnS), zinc oxide (ZnO), titanium oxide ($TiO_2$), lead sulfide (PbS), and lead telluride (PbTe). The first metal layer and the second metal layer each may include at least one metal selected from the group consisting of silver (Ag), aluminum (Al), gold (Au), cobalt (Co), chromium (Cr), copper (Cu), gadolinium (Gd), hafnium (Hf), indium (In), iridium (Ir), magnesium (Mg), manganese (Mn), molybdenum (Mo), nickel (Ni), lead (Pb), palladium (Pd), platinum (Pt), rhodium (Rh), tantalum (Ta), titanium (Ti), tungsten (W), and zinc (Zn). The diode may be a metal-semiconductor-metal heterojunction diode (MSM diode), where the MSM diode further comprises: a heterojunction between the semiconductor layer and one or more of the first metal layer and the second metal layer.

In another aspect of the present disclosure, a method for fabricating a diode comprises: providing a semiconductor having a first side and a second side opposite the first side, the semiconductor having a thickness between the first side and the second side, the thickness being based on a mean free path of a charge carrier emitted into the semiconductor; depositing a first metal on the first side of the semiconductor; and depositing a second metal on the second side of the semiconductor.

Implementations of the disclosure can include one or more of the following features. Obtaining the semiconductor may include obtaining a substrate of layered materials that includes a layer comprising the semiconductor and one or more other layers comprising at least one material that is different from the semiconductor, bonding the first side of the semiconductor to a carrier wafer to position the first metal between the semiconductor and the carrier wafer, and removing the one or more other layers to expose the second side of the semiconductor. In some implementations, depositing the first metal on the first side of the semiconductor may include patterning the first side of the semiconductor. In some implementations, depositing the first metal on the first side of the semiconductor may include depositing the first metal directly onto the first side of the semiconductor as a uniform metal film. Bonding the first side of the semiconductor to the carrier wafer may include bonding the first side of the semiconductor to the carrier wafer using an adhesive. The method may include degenerate doping of a surface of the semiconductor layer for creation of an ohmic contact.

In yet another aspect of the present disclosure, a p-type metal-semiconductor-metal heterojunction diode (MSM diode) comprises: a silicon layer having a first side and a second side opposite the first side, a surface of the first side being doped with boron at a surface concentration of $1\times10^{20}$ cm-3, the silicon layer having a thickness between the first side and the second side, the thickness of the silicon layer being 30 nm; a platinum layer deposited on the first side of the silicon layer; a first heterojunction interface between the silicon layer and the platinum layer; a cobalt layer deposited on the second side of the silicon layer; and a second heterojunction interface between the silicon layer and the cobalt layer.

In yet another aspect of the present disclosure, a n-type metal-semiconductor-metal heterojunction diode (MSM diode) comprises: a silicon layer having a first side and a second side opposite the first side, a surface of the first side being doped with phosphorus at a surface concentration of $2\times10^{20}$ cm-3, the silicon layer having a thickness between the first side and the second side, the thickness of the silicon layer being 60 nm; a first chromium layer deposited on the first side of the silicon layer; a first heterojunction interface between the first chromium layer and the silicon layer; a second chromium layer deposited on the second side of the silicon layer; and a second heterojunction interface between the second chromium layer and the silicon layer.

The details of one or more implementations are set forth in the accompanying drawings and the description below. Other features, objects, and advantages will be apparent from the description, the drawings, and the claims.

DETAILED DESCRIPTION

Figure 1:
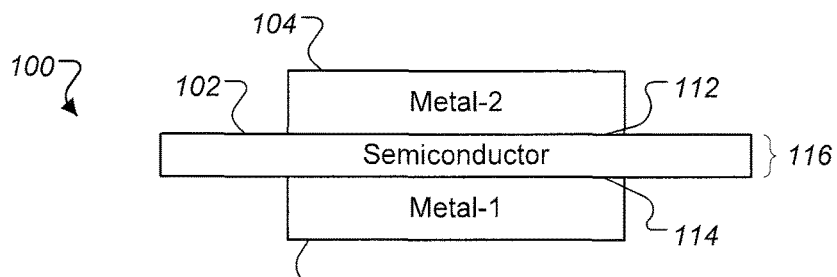
FIG. 1 shows an example of a metal-semiconductor-metal (MSM) heterojunction diode.

FIG. 1 shows an example of a metal-semiconductor-metal (MSM) heterojunction diode 100. As shown in FIG. 1, a MSM diode 100 includes a thin layer of semiconductor 102 positioned between two metal electrodes 104 and 106. The semiconductor 102 may be a crystalline semiconductor, e.g., a single-crystal crystalline semiconductor, or a polycrystalline semiconductor. A thickness 116 of the semiconductor 102 is based on, e.g., close or comparable to, a mean free path of charge carriers, which may result in near ballistic carrier transport across the semiconductor layer 102. Heterojunctions 112 and 114 of the MSM diode 100 may include two contact interfaces and energy barriers on opposite sides of the semiconductor layer 102. Asymmetric energy band structures are formed by either selecting different materials for the metals 104 and 106 or by selectively doping one side of the semiconductor layer 102.

The MSM heterojunction diode 100 may be constructed using suitable semiconductor and metal materials. The semiconductor 102 can be, but is not limited to, silicon (Si), germanium (Ge), silicon germanium (SiGe), aluminum antimonide (AlSb), gallium antimonide (GaSb), gallium arsenide (GaAs), indium antimonide (InSb), indium arsenide (InAs), indium gallium arsenide (InGaAs), indium phosphide (InP), cadmium selenide (CdSe), cadmium telluride (CdTe), lead sulfide (PbS), and lead telluride (PbTe). The metals 104 and 106 on either side of the semiconductor 102 can be, but are not limited to, silver (Ag), aluminum (Al), gold (Au), cobalt (Co), chromium (Cr), copper (Cu), gadolinium (Gd), hafnium (Hf), indium (In), iridium (Ir), magnesium (Mg), manganese (Mn), molybdenum (Mo), nickel (Ni), lead (Pb), palladium (Pd), platinum (Pt), rhodium (Rh), tantalum (Ta), titanium (Ti), tungsten (W), and zinc (Zn). Other suitable materials different than those listed above may be used. A cut-off frequency of a MSM diode may be configured by selecting different combinations of semiconductor and metal materials.

Figure 2A:
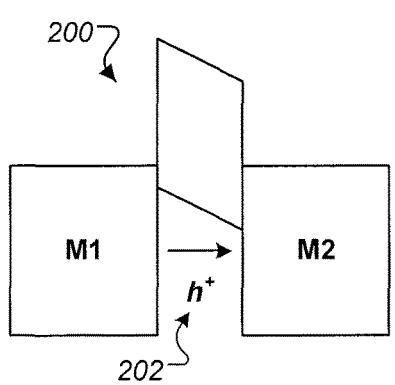
FIGS. 2A-D show examples of energy band diagrams for different MSM diodes.
Figure 2B:
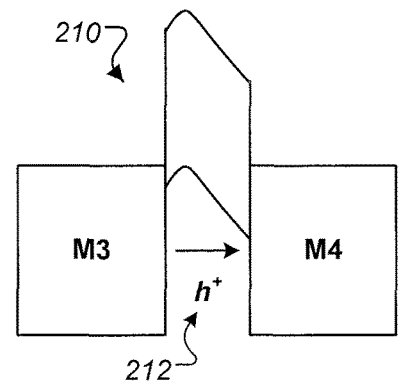
Figure 2C:
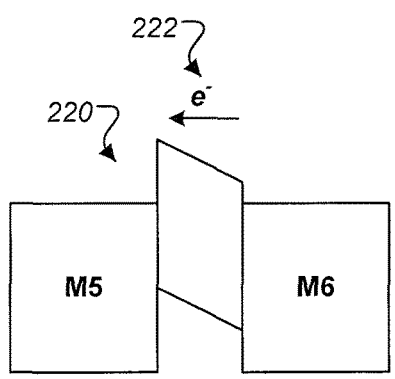
Figure 2D:
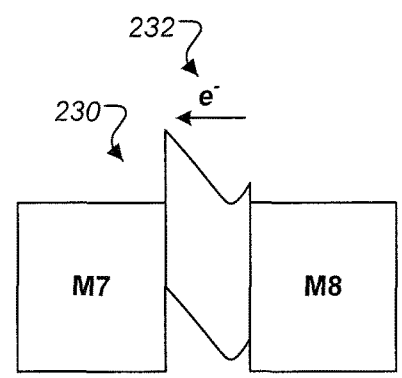

FIGS. 2A-D show examples of energy band diagrams 200, 210, 220, and 230 for different MSM diodes. In the energy band diagrams 200, 210, 220, and 230, h$^+$ and e$^-$ represent the charge carriers emitted into the semiconductor layer in a direction shown by the arrows 202, 212, 222, and 232. FIGS. 2A and 2B show energy band diagrams 200 and 210 for p-type MSM diodes. FIGS. 2C and 2D show energy band diagrams 220 and 230 for n-type MSM diodes. FIG. 2A depicts a p-type MSM diode that includes different materials for metals M1 and M2. FIG. 2C depicts a n-type MSM diode that includes different materials for metals M3 and M4. FIG. 2B depicts a p-type MSM diode that includes a semiconductor that is selectively doped on one side. FIG. 2D depicts a n-type MSM diode that includes a semiconductor that is selectively doped on one side. For the MSM diodes of FIGS. 2B and 2D having one-side selective doping of the semiconductor, metals M5 and M6 may be the same material, and metals M7 and M8 may be the same material.

Figure 3:
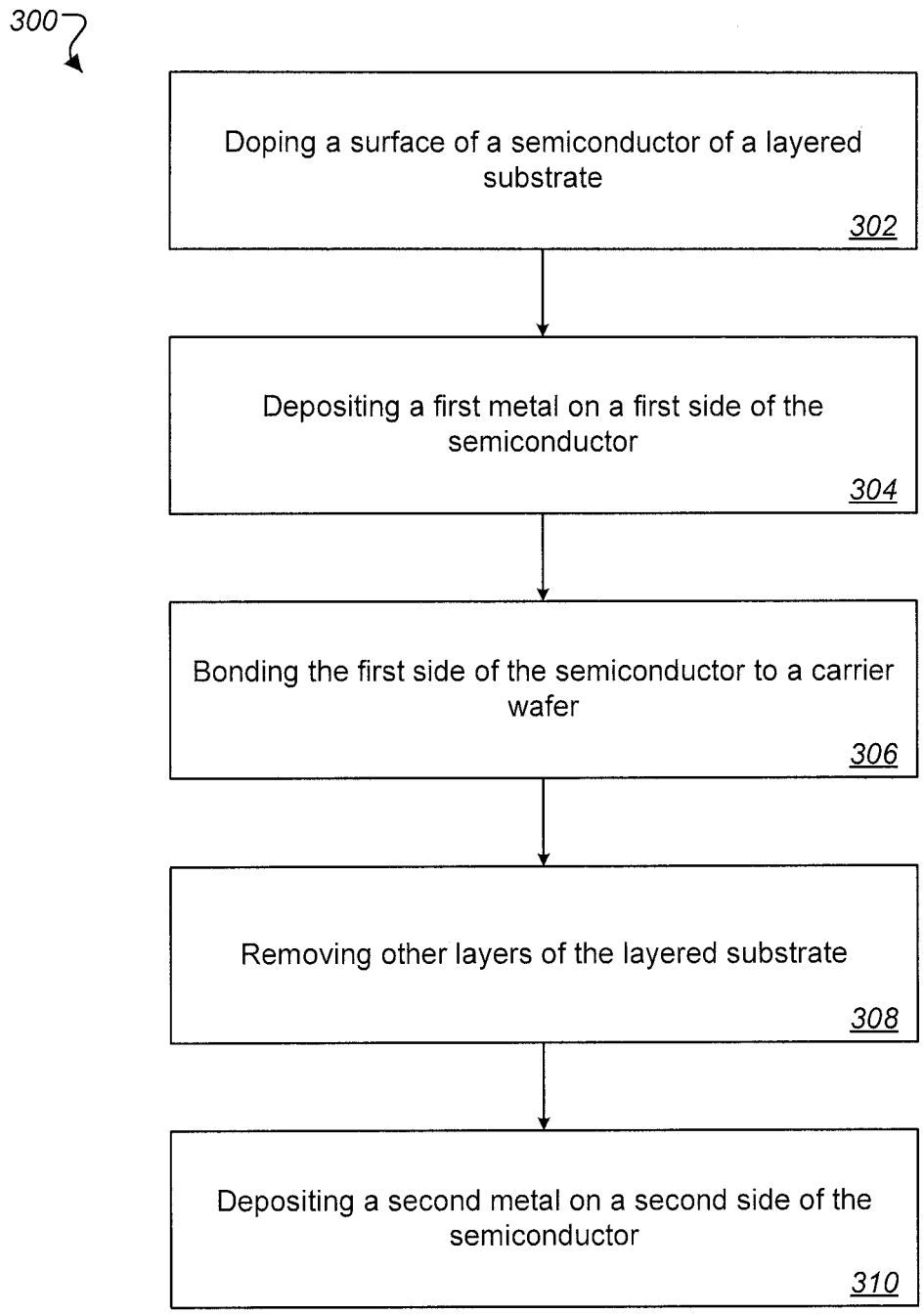
FIG. 3 is a flowchart of a process for fabricating a MSM diode.

FIG. 3 is a flowchart of a process 300 for fabricating a MSM diode. Briefly, the process 300 includes selective doping of a surface of a semiconductor of a layered substrate, e.g., a semiconductor-on-insulator (SOI) wafer (302), depositing a first metal on a first side of the semiconductor (304), bonding the first side of the semiconductor to a carrier wafer to position the first metal between the semiconductor and the carrier wafer (306), selectively removing other layers of the layered substrate, e.g., a bulk semiconductor substrate layer and an electrical insulator layer, to expose a second side of the semiconductor (308), and depositing a second metal on the second side of the semiconductor (310).

Figure 4A:
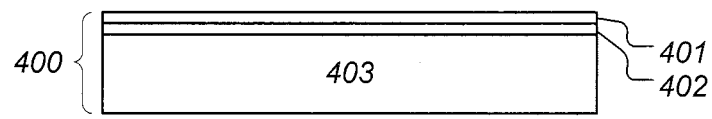
FIGS. 4A-F show side views of a MSM diode during different stages of fabrication.
Figure 4B:
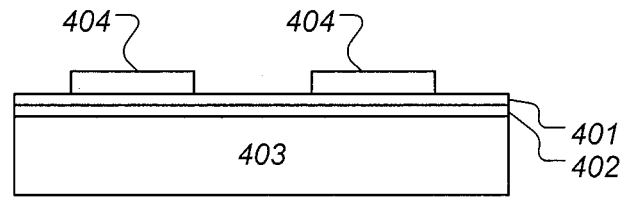
Figure 4C:
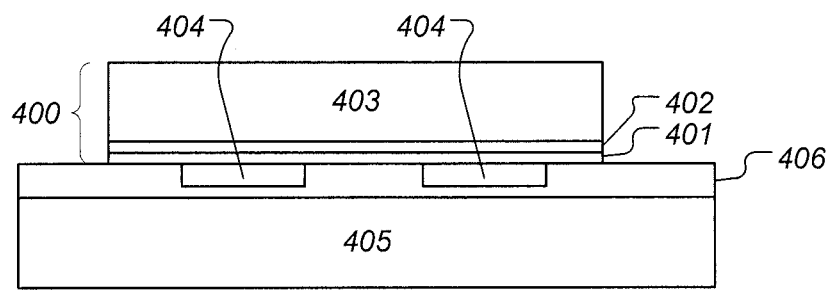
Figure 4D:
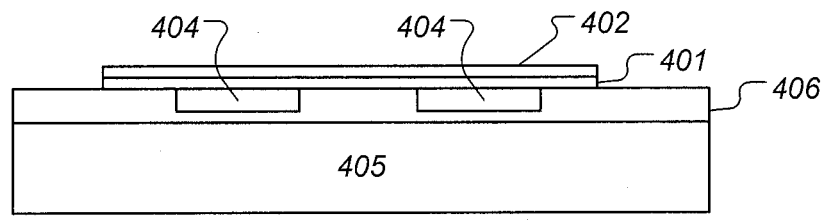
Figure 4E:
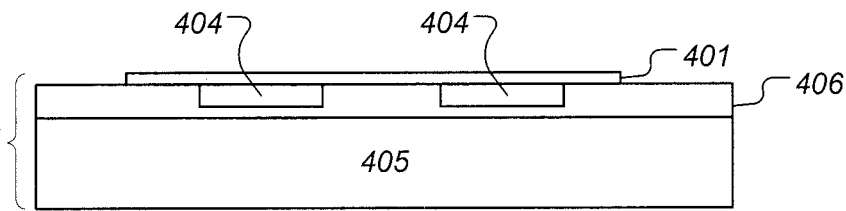
Figure 4F:
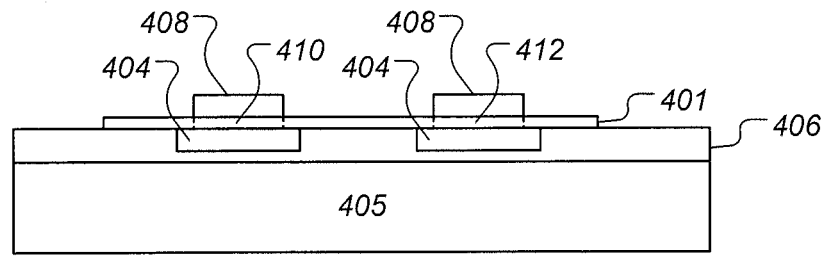

FIGS. 4A-F show side views of a MSM diode during different stages of fabrication. The MSM diode that includes a thin single-crystal semiconductor layer, e.g., silicon (Si) layer 401, of desired thickness, doping profile, and crystal orientation is provided, e.g., as shown in FIG. 4A. The MSM diode can be fabricated on a wafer scale.

A flip-bond technique may be used so that different metal layers can be patterned and deposited onto both sides of the thin semiconductor layer 401 of a layered substrate, e.g., a standard silicon-on-insulator (SOI) wafer 400 that includes a silicon layer 401, an insulator (e.g., SiO$_2$) layer 402, and a bulk silicon substrate 403. MSM heterojunctions can be fabricated from the SOI wafer 400 using selective chemical or plasma etches so that an individual layer of desired material, e.g., silicon layer 401, can be obtained and positioned between selected metals. A technique for fabricating a MSM heterojunction diode is described in detail below.

1. Shallow Contact Doping.

Depending on the application of the MSM diode, the surface of one or both sides of the silicon layer 401 can be doped for creation of an ohmic contact for carrier injection into the silicon layer 401. The silicon layer 401 has an appropriate thickness, e.g., 70 nm or below. A surface of the silicon layer 401 of the SOI wafer 400 is first cleaned and then doped with the appropriate doping type (e.g., a p-type diode being doped by a p-type dopant such as boron, and a n-type diode being doped by a n-type dopant such as phosphorus), concentration (e.g., degenerate doping to minimize surface resistivity), and depth using an appropriate method (e.g., implantation, spin-on, or gas phase diffusion).

Figure 5:
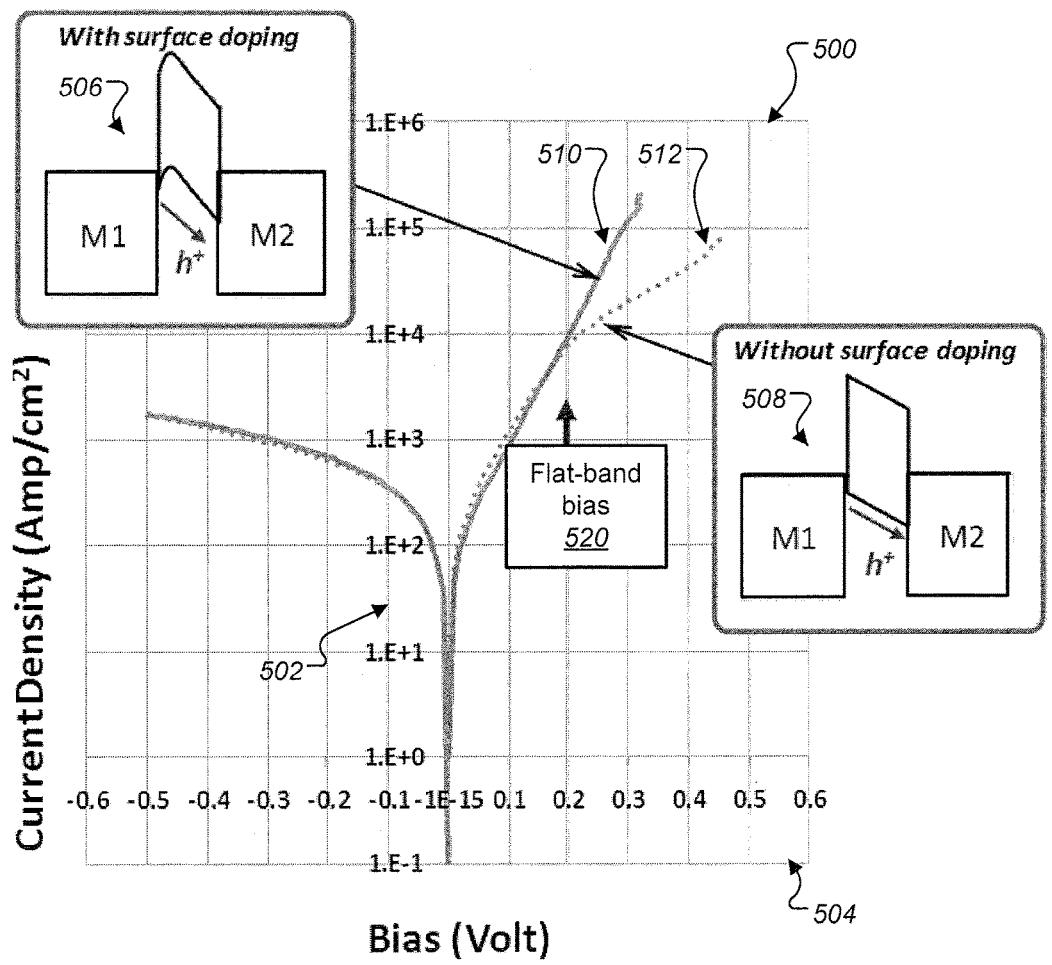
FIG. 5 is a graph showing examples of current density versus voltage (J-V) characteristics for MSM diodes with and without surface doping.

FIG. 5 depicts a graph 500 showing examples of current density versus voltage (J-V) characteristics for a MSM diode 506 with surface doping at a carrier injection side of a semiconductor layer and a MSM diode 508 without surface doping at a carrier injection side of a semiconductor layer. Graphic 500 includes axis 502, axis 504, curve 510, and curve 512. Axis 502 is the current density in amperes per cm². Axis 504 is the bias voltage in volts. Curve 510 depicts the current density versus voltage (J-V) characteristic for the MSM diode 506. Curve 512 depicts the current density versus voltage (J-V) characteristic for the MSM diode 508.

Each MSM diode 506 and 508 of FIG. 5 may be a p-type MSM diode having a cobalt (Co) layer M1, a silicon layer, and a platinum (Pt) layer M2. While the series resistance in a MSM diode is very low and is not a major current-limiting or speed-limiting component, the contact impedance Rc could become a rate-limiting factor when the diode is under a high forward bias (e.g., higher than flat-band bias). As shown in FIG. 5, a current of the MSM diode 508 without surface doping deviates from the exponential curve 510 at approximately 0.2 V, the flat-band bias 520, while a current of the MSM diode 506 with surface doping rises exponentially beyond the flat-band bias 520. Depending on specific application and operating conditions, a MSM diode may contain a semiconductor layer with a doped surface or an undoped surface.

2. Flip-bond Fabrication

Returning to FIG. 4A, the surface-doped SOI wafer 400 is patterned by standard photolithography. The patterned photoresist may be crosslinked to enhance its resistance. The SOI wafer 400 is then etched (e.g., in $O_2$ plasma) to remove any photoresist residue in the patterned areas. Any newly formed silicon dioxide in the patterned areas is removed, for example, by briefly dipping the SOI wafer 400 in buffered oxide etch (BOE).

The SOI wafer 400 is loaded into a metal deposition (e.g., electron beam evaporation or sputter) chamber. When a base pressure of the chamber is sufficiently low (e.g., less than $2 \times 10^{-6}$ Torr), a first metal 404, such as platinum (Pt), is deposited (stage (b)). The Pt layer 404 has a thickness that is sufficiently large (e.g., 15 nm) to form excellent contact with the Si layer 401. An aluminum (Al) layer (not shown) having a thickness that is sufficient for external connection or measurement contact (e.g., 100 nm) may be deposited on the Pt layer 404 at an appropriate rate (e.g., approximately 0.1 nm/sec) to ensure excellent metal film quality. Other metal materials different than Pt and Al may be used.

Following deposition of the metal layer 404, the SOI wafer 400 is flipped and bonded onto a carrier wafer 405 using an adhesive 406 (stage (c)). The metal layer 404 is positioned between the Si layer 401 and the carrier wafer 405. The adhesive 406 may be an insulating adhesive or a conducting adhesive. For example, a conducting adhesive may be used for bonding the SOI wafer 400 to the carrier wafer 405 when the surface-doped SOI wafer 400 is not patterned, e.g., when Pt and Al are directly deposited onto the surface-doped SOI wafer 400 as a uniform metal film without patterning.

At stage (d), the bulk silicon substrate 403 of the SOI wafer 400 is thinned down (e.g., by grinding or polishing using sandpaper) and completely removed by selective Si etching (e.g., using xenon difluoride ($XeF_2$) etch) to expose the $SiO_2$ layer 402. At stage (e), the $SiO_2$ layer 402 is selectively etched away (e.g., by dipping in BOE). The remaining structure 407 is the thin device silicon layer 401 with the doped side and the previously deposited metal contact and electrode 404 bonded to the carrier wafer 405 by the adhesive 406.

A second photolithography is performed to define second metal contact areas with designated registry to the Pt layer 404 on the other side of the device silicon layer 401. The patterned photoresist may be crosslinked to enhance its resistance to the etching. The structure 407 is then etched (e.g., in $O_2$ plasma) to remove any photoresist residue in the patterned areas. Any newly formed silicon dioxide in the patterned areas is removed, for example, by briefly dipping in buffered oxide etch (BOE).

The structure 407 is loaded into a metal deposition (e.g., electron beam evaporation or sputter) chamber. When the base pressure of the chamber is sufficiently low (e.g., less than $2 \times 10^{-6}$ Torr), a second metal, e.g., cobalt (Co), layer 408 is deposited (stage (f)). The Co layer 408 has a thickness that is sufficiently large (e.g., 15 nm) to form excellent contact with the Si layer 401. An aluminum (Al) layer (not shown) having a thickness that is sufficient for external connection or measurement contact (e.g., 100 nm) may be deposited on the Co layer 408 at an appropriate rate (e.g., approximately 0.1 nm/sec) to ensure excellent metal film quality. Other metal materials different than Co and Al may be used. After the second metal layer 408 is deposited, the p-type Co—Si—Pt diodes 410 and 412 are ready for any electrical measurement or application.

The photolithography described above can be replaced by using shadow masks during the metal deposition. In general, any appropriate lithographic technique, including photolithography, electron-beam lithography, and imprint lithography, can also be applied. For example, electron beam lithography can be performed as an alternative to photolithography for smaller device sizes.

Figure 6:
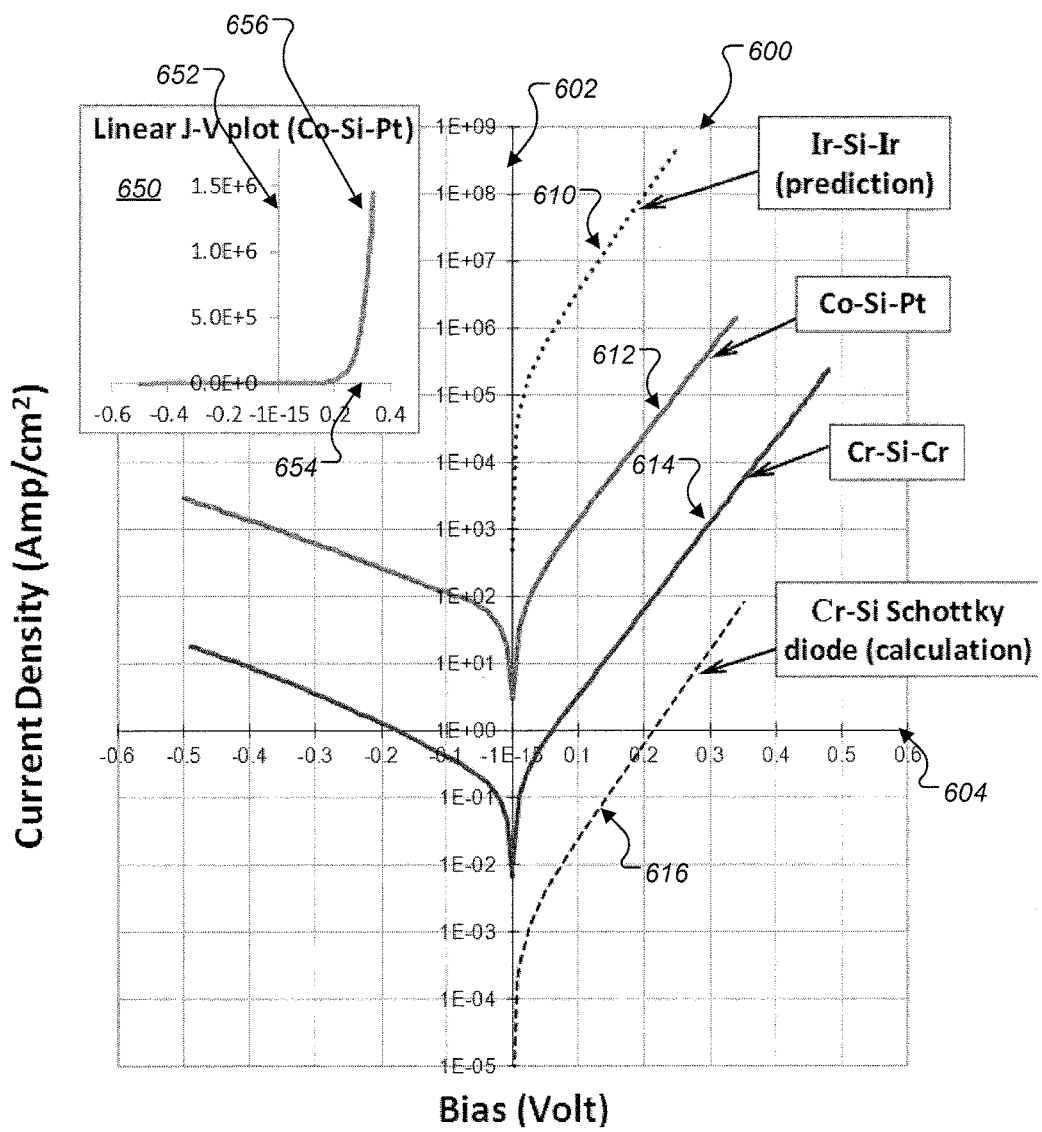
FIG. 6 is a graph showing examples of J-V characteristics for different MSM diodes and a Schottky diode.

FIG. 6 depicts a graphs 600 and 650 showing examples of current density versus voltage (J-V) characteristics for different MSM diodes and a Schottky diode. Graphs 600 include axis 602, axis 604, and curves 610, 612, 614, and 616. Axis 602 is the current density in amperes per cm². Axis 604 is the bias voltage in volts. Curve 610 depicts a predicted semi-log J-V curve of a p-type iridium-silicon-iridium (Ir—Si—Ir) diode. Curve 612 depicts an experimental semi-log J-V curve of a p-type Co—Si—Pt diode. Curve 614 depicts an experimental semi-log J-V curve of a n-type chromium-silicon-chromium (Cr—Si—Cr) diode. Curve 616 depicts a theoretical semi-log J-V curve of a Cr—Si Schottky diode. For comparison, FIG. 6 includes a calculated J-V curve 616 for a standard Cr—Si Schottky diode and a predicted J-V curve 610 for a p-type Ir—Si—Ir MSM diode. Experimental results indicate that a low barrier height MSM diode, such as a Ni—InGaAs—Ni diode or the p-type Ir—Si—Ir diode, can potentially be used to efficiently rectify optical frequency radiation at zero bias for solar to electric energy conversion. Additionally, FIG. 6 includes an inset graph 650 that includes axis 652, axis 654, and curve 656. Axis 652 is the current density in amperes per cm². Axis 654 is the bias voltage in volts. Curve 656 depicts a linear J-V curve of the p-type Co—Si—Pt diode.

Figure 7A:
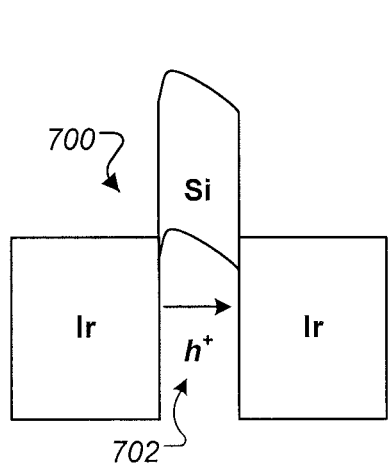
FIGS. 7A-C show examples of energy band diagrams corresponding to the different MSM diodes of FIG. 6.
Figure 7B:
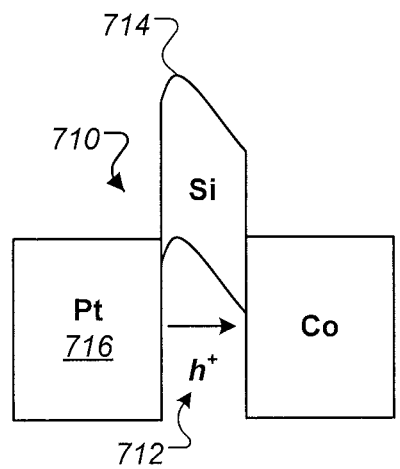
Figure 7C:
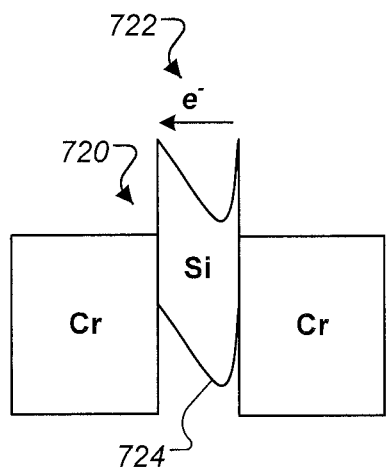
Figure 7D:
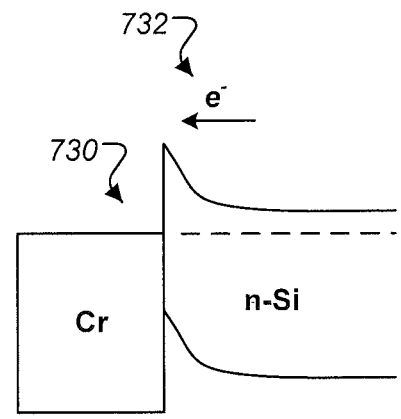
FIG. 7D shows an example of an energy band diagram corresponding to the Schottky diode of FIG. 6.

FIGS. 7A-C show examples of energy band diagrams 700, 710, and 720 corresponding to the different J-V curves 610, 612, and 614 of the different MSM diodes of FIG. 6. FIG. 7D shows an example of an energy band diagram 730 corresponding to the theoretical semi-log J-V curve 616 of the Schottky diode of FIG. 6. In the energy band diagrams 700, 710, 720, and 730, h⁺ and e⁻ represent the charge carriers emitted into the semiconductor layer in a direction shown by the arrows 702, 712, 722, and 732.

The Si layer 714 for the p-type Co—Si—Pt diode and the Si layer 724 for the n-type Cr—Si—Cr diode may be doped with a concentration of dopants that is $5 \times 10^{15}$ cm$^{-3}$ or less. For the p-type Co—Si—Pt diode, a thickness of the Si layer 714 may be approximately 30 nm, and a surface in contact with the Pt layer 716 may be degenerately doped with boron with an estimated surface concentration of approximately $1 \times 10^{20}$ cm$^{-3}$. For the n-type Cr—Si—Cr device, a thickness of the Si layer 724 may be approximately 60 nm, and one side of the Si layer 724 may be degenerately doped with phosphorous with an estimated surface concentration of approximately $2 \times 10^{20}$ cm$^{-3}$. Contact resistances Rc, i.e., carrier tunneling impedances from metal into Si, were calculated to be approximately $5 \times 10^{-9}$ Ωcm² and $2 \times 10^{-8}$ Ωcm² for Pt—Si and Cr—Si interfaces, respectively.

A size of a MSM diode is defined by an overlap in a section of a semiconductor layer between top and bottom metal contacts of the diode. J-V curves for both p-type and n-type MSM diodes exhibit an exponential rise as a function of forward bias, given by the following equation:

$$J(V) = J_0[\exp(qV/\eta k_B T) - 1], \quad (1)$$

where $J_0$ is the saturation current density, T is the temperature, q is the electron charge, V is the bias across the diode, $k_B$ is the Boltzmann constant, and η is the ideality factor which is 1.25 for both p-type and n-type devices. Generally, the thicknesses of the silicon layers of the devices result in current-voltage (I-V) characteristics that follow thermionic emission mechanism. Tunneling contribution is expected to be small, especially at low biases. The corresponding $J_0$ for the Co—Si—Pt and Cr—Si—Cr diodes are $8.5 \times 10^1$ A/cm² and $1.3 \times 10^{-1}$ A/cm², respectively. These values are significantly higher than values of $J_0$ for Co—Si and Cr—Si Schottky diodes.

While a MSM diode described in the present disclosure may have some features similar to a typical Schottky diode, a MSM diode includes features that are different than a typical Schottky diode. For example, in a MSM diode, carriers are launched directly from a metal emitter where an electron density is very high, and carriers travel across the semiconductor ballistically. Additionally, with both metal emitter and collector, a series resistance $R_s$ in a MSM diode can be lower than $10^{-11}$ Ωcm², which may be virtually negligible, leading to a cut-off frequency higher than 100 THz.

Due to a high current density, a true cut-off frequency limit of a MSM diode was not fully characterized before an electrical contact away from a diode junction was "burned". Based on the J-V curves shown in FIG. 6, which show that currents of the MSM diodes do not exhibit noticeable deviation from the exponential rising curves, the upper limit of the series resistances can be estimated to be $5 \times 10^{-9}$ Ωcm² and $3 \times 10^{-8}$ Ωcm² for the Co—Si—Pt and the Cr—Si—Cr diodes respectively, according to a noise level in the measurement.

Since the silicon layer is completely depleted, a capacitance of a MSM diode can be evaluated by the following equation:

$$C = \varepsilon A/d, \quad (2)$$

where ε is a dielectric constant, A is a device size, and d is a thickness of a silicon layer. Corresponding capacitances for the Co—Si—Pt and the Cr—Si—Cr devices when normalized to 1 cm² are $3.5 \times 10^{-7}$ F and $1.8 \times 10^{-7}$ F, respectively. The cut-off frequencies can be evaluated by the following equation:

$$F = 1/(2\pi R_s C), \quad (3)$$

and are estimated to be $1 \times 10^{14}$ Hz and $3.7 \times 10^{13}$ Hz for the Co—Si—Pt and Cr—Si—Cr diodes, respectively.

Table 1 below summarizes saturation current densities $J_0$ for different diode devices. The observed saturation current density of a MSM diode is substantially higher than that of a conventional Schottky diode with identical current limiting metal-semiconductor junctions, for both p-type and n-type MSM devices. The observed $J_0$ for both p-type and n-type diodes are between 100-1000 times higher than values calculated using a typical thermionic emission mechanism that assumes only certain carriers can contribute to the electric current. These carriers have vertical (to the junction interface) components of their velocities v⊥ that can provide enough kinetic energy to overcome the barriers.

TABLE 1

Saturation current densities of Schottky and MSM diodes.

| | Emission limiting barrier height (eV) | $J_0$-Schottky diode (A/cm²) | $J_0$-MSM diode (A/cm²) |
|---|---|---|---|
| Co—Si(p) | 0.45 | $9 \times 10^{-2}$ | $8.5 \times 10^1$ |
| Cr—Si(n) | 0.6 | $1 \times 10^{-3}$ | $1.3 \times 10^{-1}$ |
| Cr—Si(p) | 0.57 | $1.3 \times 10^{-3}$ | $3 \times 10^{-1}$ |

T = 300K and Richardson constant = 120 A/(cm²K²) were used for the calculation.

A number of implementations have been described. Nevertheless, various modifications can be made without departing from the spirit and scope of the processes and techniques described herein. In addition, the processes depicted in the figures do not require the particular order shown, or sequential order, to achieve desirable results. In addition, other steps can be provided, or steps can be eliminated, from the described processes, and other components can be added to, or removed from, the describe apparatus and systems. Accordingly, other embodiments are within the scope of the following claims.

What is claimed is:

1. A method for fabricating a diode, comprising:
   providing a semiconductor layer having a first side and a second side opposite the first side, the semiconductor layer having a thickness between the first side and the second side, the thickness being based on a mean free path of a charge carrier emitted into the semiconductor;
   depositing a first metal on the first side of the semiconductor layer;
   depositing a second metal on the second side of the semiconductor layer; and
   obtaining a substrate of layered materials that includes a layer comprising the semiconductor layer and one or more other layers comprising at least one material that is different from the semiconductor layer;

wherein the thickness of the semiconductor layer is comparable to or less than the mean free path of the charge carrier emitted into the semiconductor layer.

2. The method of claim 1, wherein providing the semiconductor layer comprises:
bonding the first side of the semiconductor layer to a carrier wafer to position the first metal between the semiconductor layer and the carrier wafer; and
removing the one or more other layers to expose the second side of the semiconductor layer.

3. The method of claim 2, wherein:
depositing the first metal on the first side of the semiconductor layer comprises depositing the first metal directly onto the first side of the semiconductor layer as a uniform metal film; and
bonding the first side of the semiconductor layer to the carrier wafer comprises bonding the first side of the semiconductor layer to the carrier wafer using an adhesive.

4. The method of claim 2, wherein:
depositing the first metal on the first side of the semiconductor layer comprises depositing the first metal directly onto the first side of the semiconductor layer as a uniform metal film; and
bonding the first side of the semiconductor layer to the carrier wafer comprises bonding the first side of the semiconductor layer to the carrier wafer using an insulator.

5. The method of claim 2, wherein:
depositing the first metal on the first side of the semiconductor layer comprises patterning the first metal on the first side of the semiconductor layer; and
bonding the first side of the semiconductor layer to the carrier wafer comprises bonding the first side of the semiconductor layer to the carrier wafer using an insulator.

6. The method of claim 1, wherein the first metal and the second metal are of a same metal, and the method further comprises:
degenerate doping of a surface of the semiconductor layer for creation of an ohmic contact.

7. The method of claim 1, wherein the first metal and the second metal are different metals.

8. The method of claim 7, further comprising:
degenerate doping of a surface of the semiconductor layer for creation of an ohmic contact.

9. The method of claim 1, wherein the semiconductor layer comprises one or more of a crystalline semiconductor and a polycrystalline semiconductor.

10. The method of claim 9, wherein the semiconductor layer comprises one or more of silicon (Si), germanium (Ge), silicon germanium (SiGe), aluminum antimonide (AlSb), gallium antimonide (GaSb), gallium arsenide (GaAs), indium antimonide (InSb), indium arsenide (InAs), indium gallium arsenide (InGaAs), gallium nitride (GaN), indium phosphide (InP), cadmium selenide (CdSe), cadmium telluride (CdTe), cadmium sulfide (CdS), zinc selenide (ZnSe), zinc telluride (ZnTe), zinc sulfide (ZnS), zinc oxide (ZnO), titanium oxide (TiO$_2$), lead sulfide (PbS), and lead telluride (PbTe).

11. The method of claim 1, wherein the first metal and the second metal each comprise at least one metal selected from the group consisting of silver (Ag), aluminum (Al), gold (Au), cobalt (Co), chromium (Cr), copper (Cu), gadolinium (Gd), hafnium (Hf), indium (In), iridium (Ir), magnesium (Mg), manganese (Mn), molybdenum (Mo), nickel (Ni), lead (Pb), palladium (Pd), platinum (Pt), rhodium (Rh), tantalum (Ta), titanium (Ti), tungsten (W), and zinc (Zn).

12. The method of claim 1, wherein the diode is configured for operation at a frequency exceeding 100 THz.

13. The method of claim 1, further comprising forming a metal-semiconductor-metal heterojunction diode (MSM diode) using the first metal, the semiconductor layer, and the second metal.

14. The method of claim 1, further comprising doping one or more sides of the semiconductor layer for contact barrier height adjustment.

15. The method of claim 1, further comprising configuring the semiconductor layer for near ballistic conduction.

16. The method of claim 1, further comprising:
forming a first heterojunction between the semiconductor layer and the first metal or between the semiconductor layer and the second metal, wherein the semiconductor layer, the first metal, and the second metal are configured for the charge carrier to perform ballistic conduction from the first metal, through the semiconductor layer and to the second metal.

17. The method of claim 16, further comprising forming a second heterojunction, wherein the second heterojunction is on a side of the semiconductor layer opposite the first heterojunction.

18. The method of claim 1, wherein the first metal is a metallic layer.

19. The method of claim 1, wherein the second metal is a metallic layer.

20. A method for fabricating a diode, comprising:
providing a semiconductor layer having a first side and a second side opposite the first side, the semiconductor layer having a thickness between the first side and the second side, the thickness being based on a mean free path of a charge carrier emitted into the semiconductor;
depositing a first metal on the first side of the semiconductor layer;
depositing a second metal on the second side of the semiconductor layer;
obtaining a substrate of layered materials that includes a layer comprising the semiconductor layer and one or more other layers comprising at least one material that is different from the semiconductor layer; and
configuring the semiconductor layer for near ballistic conduction.

* * * * *